US008072813B2

(12) United States Patent
Lue et al.

(10) Patent No.: US 8,072,813 B2
(45) Date of Patent: Dec. 6, 2011

(54) METHOD AND APPARATUS FOR PROGRAMMING NONVOLATILE MEMORY

(75) Inventors: Hang-Ting Lue, Hsinchu (TW); Tzu Hsuan Hsu, Jhongpu Township (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 12/715,996

(22) Filed: Mar. 2, 2010

(65) Prior Publication Data

US 2010/0157686 A1 Jun. 24, 2010

Related U.S. Application Data

(63) Continuation of application No. 12/188,499, filed on Aug. 8, 2008, now Pat. No. 7,701,769.

(60) Provisional application No. 60/955,392, filed on Aug. 13, 2007.

(51) Int. Cl.
*G11C 11/34* (2006.01)
*G11C 16/04* (2006.01)
(52) U.S. Cl. .............................. 365/185.18; 365/185.23
(58) Field of Classification Search ............. 365/185.18, 365/185.23, 185.14, 185.17
See application file for complete search history.

(56) References Cited

U.S. PATENT DOCUMENTS

| 6,072,721 | A | 6/2000 | Arase |
| 6,987,694 | B2 * | 1/2006 | Lee ........................ 365/185.17 |
| 7,295,478 | B2 * | 11/2007 | Wan et al. ..................... 365/195 |
| 7,492,633 | B2 * | 2/2009 | Mokhlesi ................. 365/185.02 |
| 7,701,769 | B2 | 4/2010 | Lue et al. |
| 2007/0115724 | A1 | 5/2007 | Hwang |
| 2009/0027959 | A1 | 1/2009 | Lee |

OTHER PUBLICATIONS

Hang-Ting Lue et al. "A Novel Gate-Injection Program/Erase P-Channel NAND-Type Flash Memory with High (10M Cycle) Endurance" 2007 Symposium on VLSI Technology Digest of Technical Papers, pp. 140-141.
Kang-Deog Suh et al. "A 3.3 V 32 Mb NAND Flash Memory with Incremental Step Pulse Programming Scheme" IEEE Journal of Solid-State Circuits, vol. 30, No. 11, Nov. 1995, pp. 1149-1156.

* cited by examiner

*Primary Examiner* — Anh Phung
(74) *Attorney, Agent, or Firm* — Kenta Suzue; Haynes Beffel & Wolfeld LLP (57) ABSTRACT

A nonvolatile memory has logic which performs a programming operation, that controls a series of programming bias arrangements to program at least a selected memory cell of the memory array with data. The series of programming bias arrangements include multiple sets of changing gate voltage values to the memory cells.

24 Claims, 12 Drawing Sheets

METHOD AND APPARATUS FOR PROGRAMMING NONVOLATILE MEMORY

REFERENCE TO RELATED APPLICATION

This application is a continuation of U.S. application Ser. No. 12/188,499, filed on 8 Aug. 2008, now U.S. Pat. No. 7,701,769, issued on Apr. 20, 2010, which claims the benefit of U.S. Provisional Patent Application No. 60/955,392 filed on 13 Aug. 2007. Both applications are incorporated by reference herein.

BACKGROUND

1. Field of the Invention

The field of technology relates to programming a nonvolatile memory array.

2. Description of Related Art

The program operation of a nonvolatile memory cell is complicated by the program disturb effect. Programming refers to adding charge to, or removing charge from, selected memory cells of a memory array, unlike the indiscriminate erase operation which resets typically an entire sector of memory cells to the same charge storage state. The invention encompasses both products and methods where programming refers to making the net charge stored in the charge trapping structure more negative or more positive, and products and methods where erasing refers to making the net charge stored in the charge trapping structure more negative or more positive. In the program disturb effect, programming of a selected cell leads to unwanted programming of unselected memory cells.

SUMMARY

One aspect of the technology is an integrated circuit, which has a nonvolatile NAND memory array, multiple word lines, multiple bit lines, and logic coupled to the memory array.

The memory array has multiple columns. Each column includes multiple memory cells arranged in a series having a first end and a second end. Many embodiments refer to this as a NAND array. Each memory cell has a semiconductor body region with source and drain regions, a charge storage structure storing at least one charge storage state, and one or more storage dielectric structures. The semiconductor region of each NAND string in the array below the gates may have junctions or be junction-free. The channel region may have one of n-type and p-type conductivity. In various embodiments, the charge storage structure includes charge trapping material or polysilicon.

Such storage dielectric structures are at least partly between the charge trapping structure and the semiconductor body region, and at least partly between the charge trapping structure and the gate.

In some embodiments, such storage dielectric structures include a tunneling dielectric layer, a first blocking dielectric layer, and a second blocking dielectric layer. The first blocking dielectric layer contacts the charge trapping dielectric layer. The tunneling dielectric layer and the second blocking dielectric layer contact different ones, of the gate and a channel surface of the semiconductor body region. Other embodiments have any of floating gate, charge trapping, and nanoparticle material as charge storage material.

Various embodiments of the memory cells are n-channel devices or p-channel devices.

The multiple word lines are the source of gate voltage to memory cells of the memory array.

The multiple bit lines access one of the ends of the series of memory cells.

The logic coupled to the memory array performs operations by controlling bias arrangements of at least the multiple word lines and the first and second ends of the series of memory cells. One of the operations is a programming operation.

The programming operation controls a series of programming bias arrangements to program at least a selected memory cell of the memory array with data. The series of programming bias arrangements include multiple sets of changing gate voltage values to the memory cells. A first set of changing gate voltage values is applied, at least partly via a selected word line, to a row of memory cells including the selected memory cell. A second set of changing gate voltage values is applied, at least partly via other word lines by the first word line, to unselected rows of memory cells. Responsive to the programming operation, the charge storage state of the charge storage structure of the selected memory cell represent the data.

In some embodiments, the series of programming bias arrangements also include a column select gate voltage applied to a column select word line of the plurality of word lines, a first bit line voltage applied to a selected NAND column of the nonvolatile NAND memory array including the selected memory cell, and a second bit line voltage applied to unselected NAND columns of the nonvolatile NAND memory array not including the selected memory cell.

In some embodiments, due to the series of programming bias arrangements, pass transistors in the unselected NAND columns receiving the column select gate voltage turn off. The pass transistors turning off, is responsive to capacitive coupling between a body of the pass transistors and the selected word line, which receives a word line program voltage. This is a result of "self-boosting".

The multiple sets of changing gate voltage values applied to the first world line of the memory cell selected for programming, and other word lines by the first word line, is helpful in reducing the program disturb effect. Program disturb is the threshold voltage shift, resulting from a programming operation, of a memory cell that was not selected for programming. In some embodiments, a magnitude of program disturb of a memory cell not selected for programming and receiving gate voltage from the word line of the memory cell selected for programming, is less than 1 volt.

In some embodiments, the first set of changing gate voltage values (e.g. applied to the first word line of the selected memory cell), begins with a voltage magnitude of between 6 V to 13 V, continues with voltage steps of magnitude between 0.1 V to 0.5 V, each value applied for a period between 0.1 μs to 20 μs. Alternative embodiments have voltage steps of negative value, added to a word line voltage of negative value.

In some embodiments, the second set of changing gate voltage values (e.g. applied to the second word line of the selected memory cell), begins with a voltage magnitude of between 6 V to 13 V, continues with voltage steps of magnitude between 0.1 V to 0.5 V, each value applied for a period between 0.1 μs to 20 μs.

Some embodiments relate to biasing the bit lines the self-boosting of the memory cells to reduce program disturb. For example, a first bit line which is coupled to a column of memory cells including the selected memory cell undergoing programming, is biased with a first bit line voltage. And, other bit lines, that are coupled to columns of memory cells not including the selected memory cell undergoing programming, are biased with another bit line voltage between the first bit line voltage and the first set of changing gate voltage values applied to the word line of the selected memory cell undergoing programming.

Another aspect of the technology is a method of operating a nonvolatile memory integrated circuit described herein.

Another aspect of the technology is an integrated circuit memory device, with a plurality of memory cells including a memory cell selected for programming, a plurality of word lines coupled to the memory cells which include a first word line and a second word line, and a circuit coupled to the word lines.

The circuit is adapted to program the memory cell selected for programming, by performing:
  during a first programming period, provide a first voltage to the first word line and a second voltage to the second word line, and
  during a second programming period, provide a third voltage to the first word line and a fourth voltage to the second word line, An absolute value of the third voltage is larger than an absolute value of the first voltage, and an absolute value of the fourth voltage is larger than an absolute value of the second voltage.

Another aspect of the technology is an integrated circuit memory device, with a plurality of memory cells including a memory cell selected for programming, a plurality of conductive lines coupled to the memory cells which include a first conductive line and a second conductive line, a circuit. The circuit applies, during a same period of programming the memory cell selected for programming, a first plurality of pulses to the first conductive line and a second plurality of pulses to the second conductive line during a same period. The first plurality of pulses include multiple pulses having different magnitudes, and the second plurality of pulses includes multiple pulses having different magnitudes.

DETAILED DESCRIPTION

Figure 1:
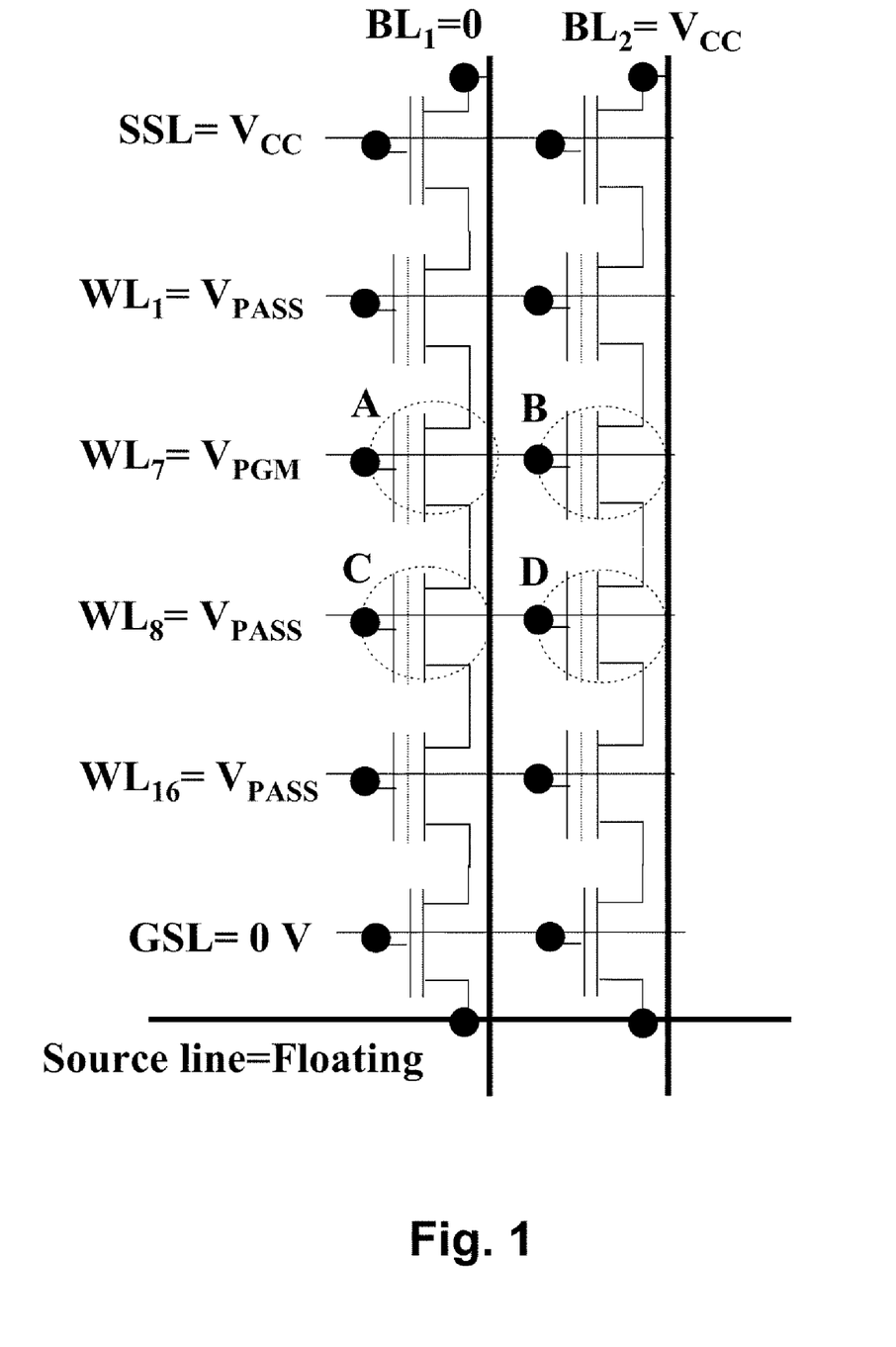
FIG. 1 shows columns of series-connected n-channel memory cells undergoing a programming operation with self-boosting.

FIG. 1 shows columns of series-connected n-channel memory cells undergoing a programming operation with self-boosting. Shown are two series connected columns each with two ends. One end of both columns is connected to source voltage line, shown as having a floating voltage. The other end of both columns is connected to different bit lines, $BL_1$ and $BL_2$. Bit line $BL_1$ has a ground voltage, and bit line $BL_2$ has voltage $V_{CC}$. The columns of series-connected n-channel memory cells receive gate voltage from multiple word lines, indicated as SSL (string select line), $WL_1, \ldots, WL_7, WL_8, \ldots, WL_{16}$, GSL (ground select line). Word line SSL has voltage $V_{CC}$. Word line GSL has a ground voltage. Word line $WL_7$ has voltage $V_{PGM}$. The other word lines WL# (but not $WL_7$) have a voltage $V_{PASS}$. Several of the memory cell are marked "A", "B", "C", and "D".

Figure 2:
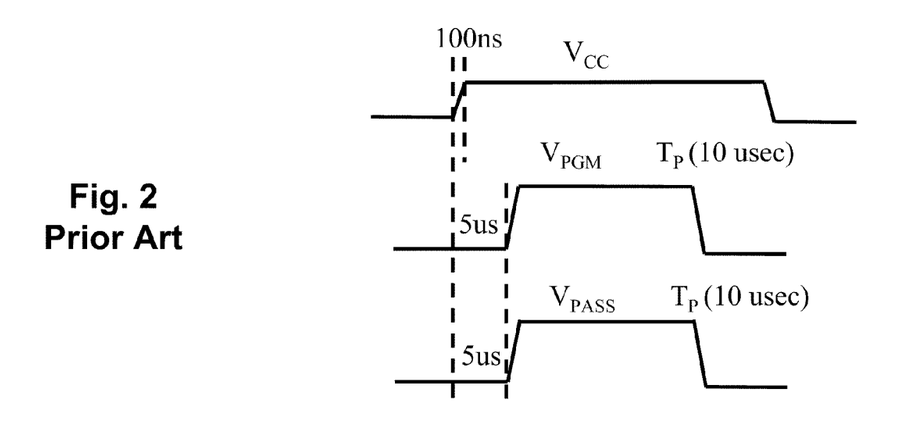
FIGS. 2-4 show traces of voltage versus time, of several shots in a series of gate voltage values applied to the series-connected memory cells, shown in FIG. 1, undergoing a programming operation with self-boosting.
Figure 3:
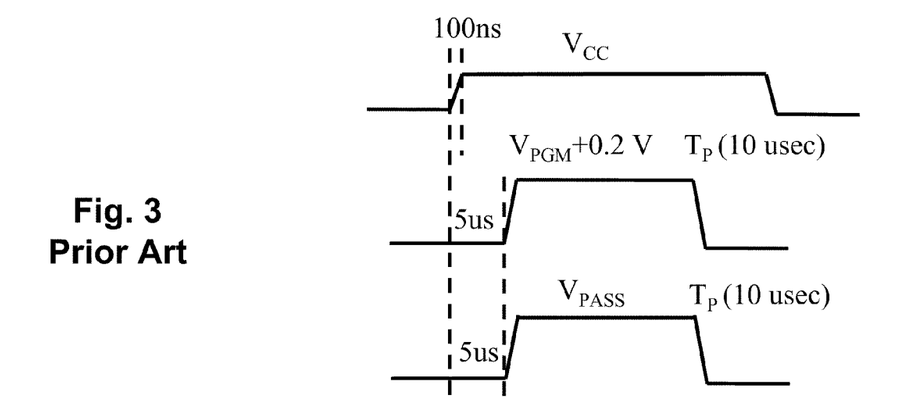
Figure 4:
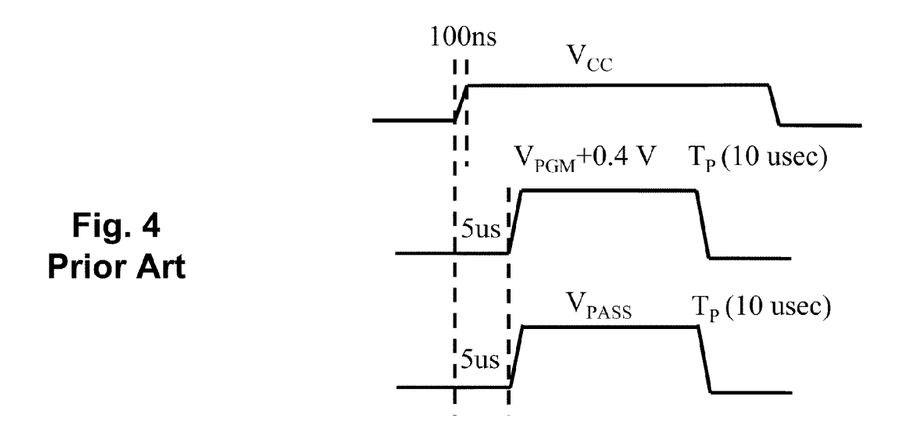

FIGS. 2-4 show traces of voltage versus time, of several shots in a series of gate voltage values applied to the series-connected memory cells, shown in FIG. 1, undergoing a programming operation with self-boosting. In particular, FIG. 2 shows a first program shot, FIG. 3 shows a second program shot, and FIG. 4 shows a third program shot.

In FIG. 2, both $V_{PGM}$ and $V_{PASS}$ are shown as 10 usec pulses, which begin 5 usec after the $V_{CC}$ pulse. In FIG. 3, the size the $V_{PGM}$ pulse is increased by 0.2 V, relative to FIG. 2. In FIG. 4, the size the $V_{PGM}$ pulse is increased by 0.4 V, relative to FIG. 2. This programming method is called the ISPP (incremental step pulse programming) method.

Figure 5:
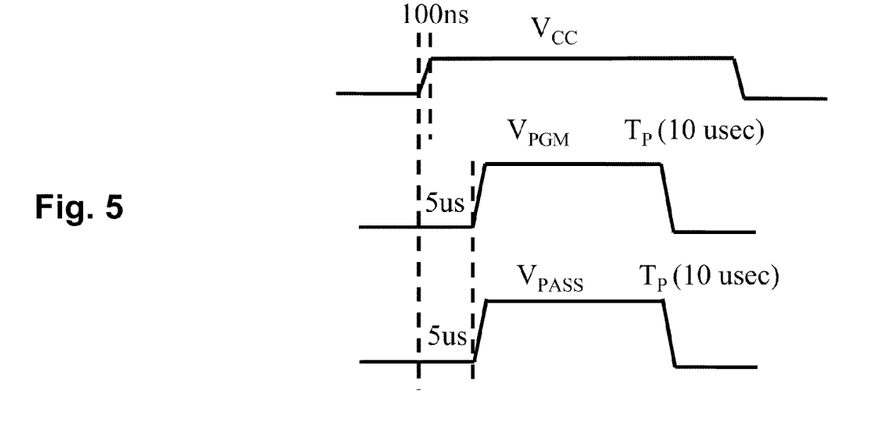
FIGS. 5-7 show traces of voltage versus time, of several shots in a series of gate voltage values applied to the series-connected memory cells, shown in FIG. 1, undergoing a programming operation with self-boosting, resulting in improved voltage disturb.
Figure 6:
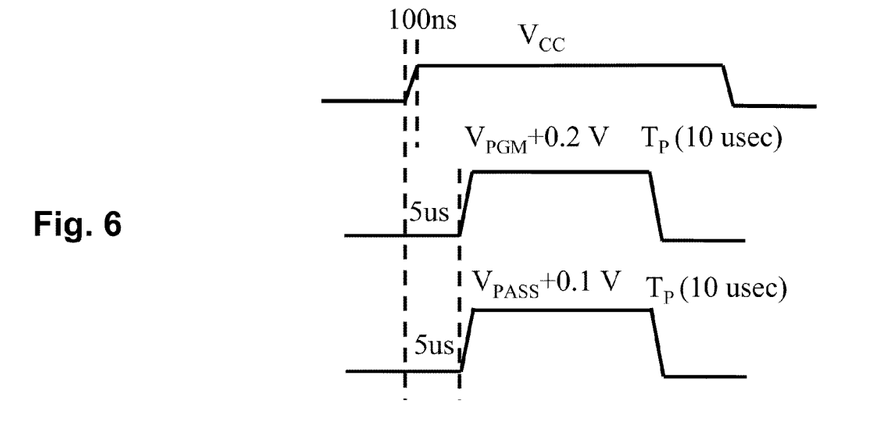
Figure 7:
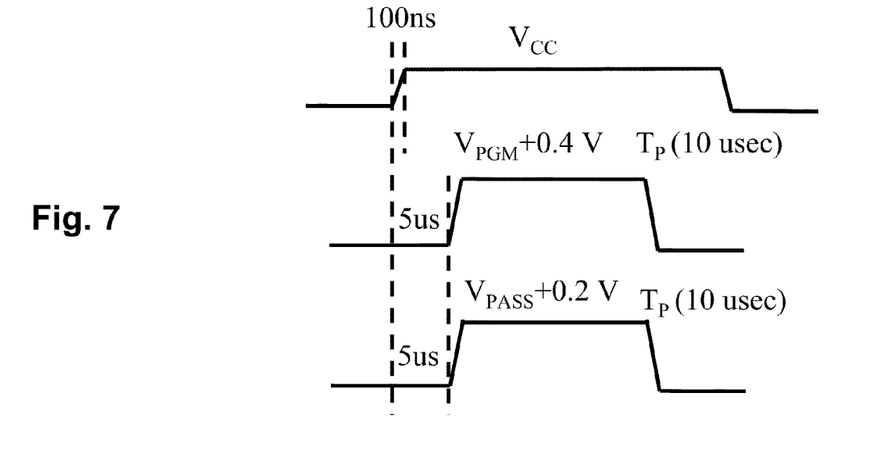

FIGS. 5-7 show traces of voltage versus time, of several shots in a series of gate voltage values applied to the series-connected memory cells, shown in FIG. 1, undergoing a programming operation with self-boosting, resulting in improved voltage disturb. In particular, FIG. 5 shows a first program shot, FIG. 6 shows a second program shot, and FIG. 7 shows a third program shot.

In FIG. 5, both $V_{PGM}$ and $V_{PASS}$ are shown as 10 usec pulses, which begin 5 usec after the $V_{CC}$ pulse. In FIG. 6, the size the $V_{PGM}$ pulse is increased by 0.2 V, relative to FIG. 5; and the size the $V_{PASS}$ pulse is increased by 0.1 V, relative to FIG. 5. In FIG. 7, the size the $V_{PGM}$ pulse is increased by 0.4 V, relative to FIG. 5; and the size the $V_{PASS}$ pulse is increased by 0.2 V, relative to FIG. 5.

Figure 8:
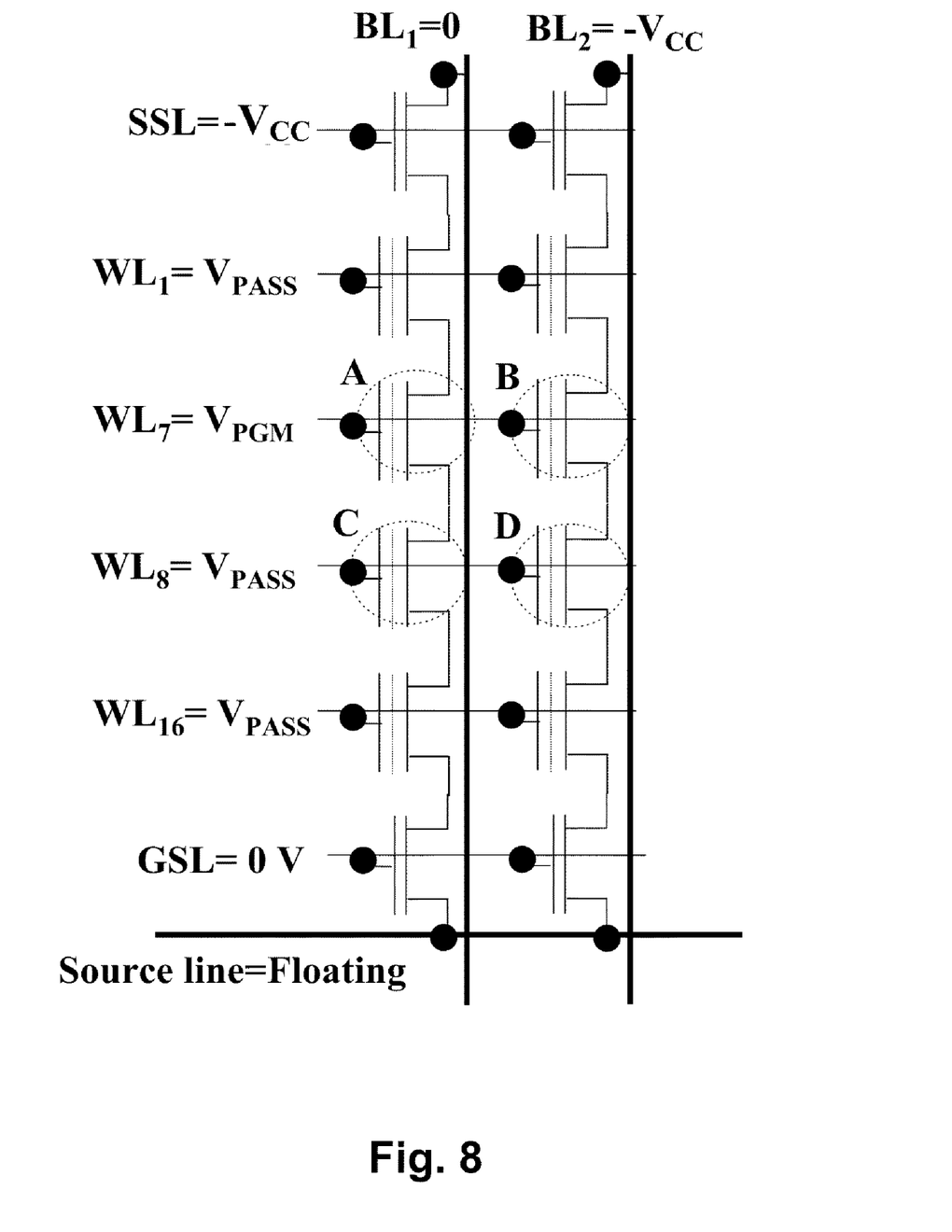
FIG. 8 shows columns of series-connected p-channel memory cells undergoing a programming operation with self-boosting.

FIG. 8 shows columns of series-connected p-channel memory cells undergoing a programming operation with self-boosting. The arrangement of word line names and bit line names is the same as in FIG. 1. However, because the memory cells are p-channel rather than n-channel, the voltages are correspondingly different. For example, bit line $BL_2$ and word line SSL have voltage $-V_{CC}$.

Figure 9:
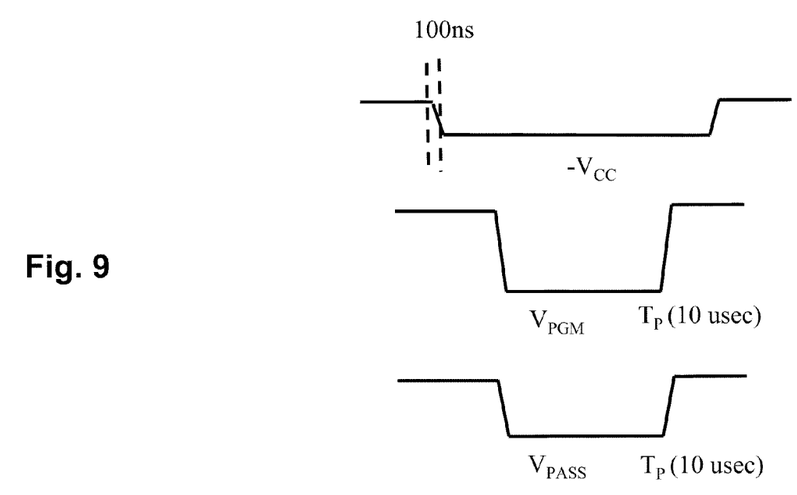
FIGS. 9-10 show traces of voltage versus time, of several shots in a series of gate voltage values applied to the series-connected memory cells, shown in FIG. 8, undergoing a programming operation with self-boosting, resulting in improved voltage disturb.
Figure 10:
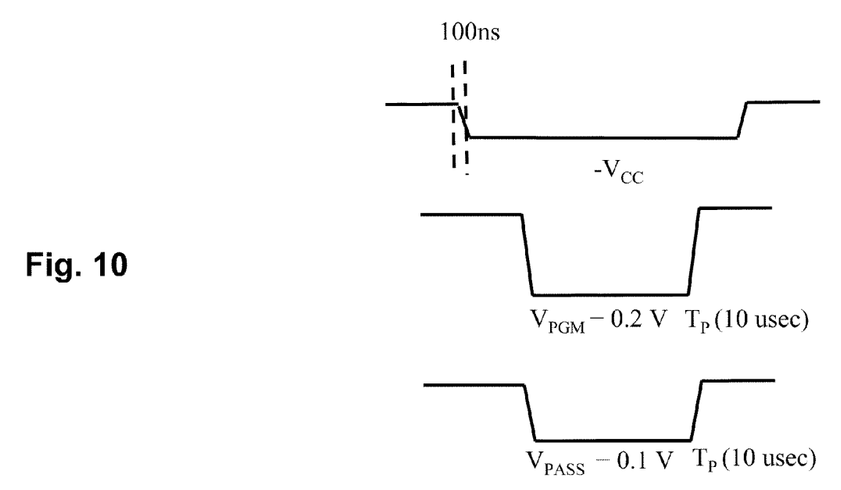

FIGS. 9-10 show traces of voltage versus time, of several shots in a series of gate voltage values applied to the series-connected memory cells, shown in FIG. 8, undergoing a programming operation with self-boosting, resulting in improved voltage disturb.

In FIG. 9, both $V_{PGM}$ and $V_{PASS}$ are shown as 10 usec pulses occurring during the $-V_{CC}$ pulse. In FIG. 10, the size the $V_{PGM}$ pulse is decreased (i.e. more negative) by −0.2 V, relative to FIG. 9; and the size the $V_{PASS}$ pulse is decreased (i.e. more negative) by −0.1 V, relative to FIG. 9.

Figure 11:
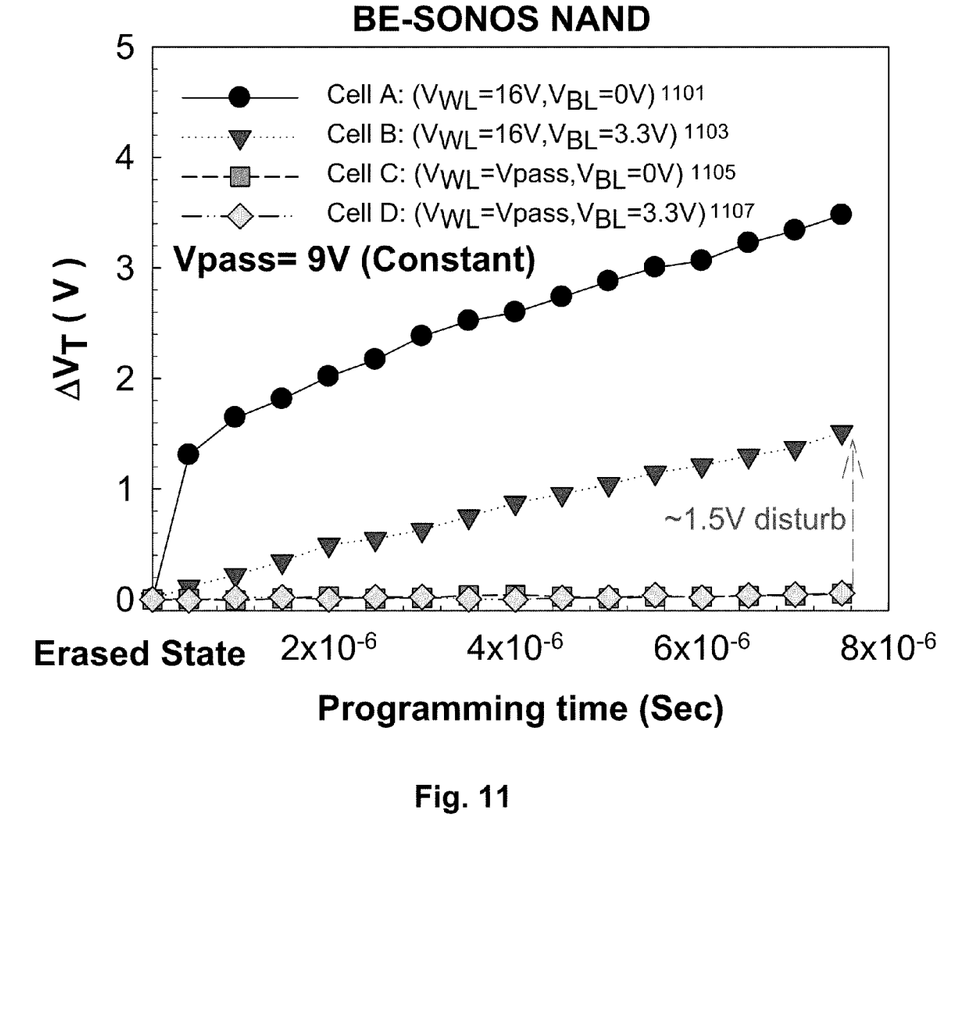
FIGS. 11-12 show traces of threshold voltage change versus time, of differently biased memory cells in columns of series-connected memory cells undergoing a programming operation with self-boosting.
Figure 12:
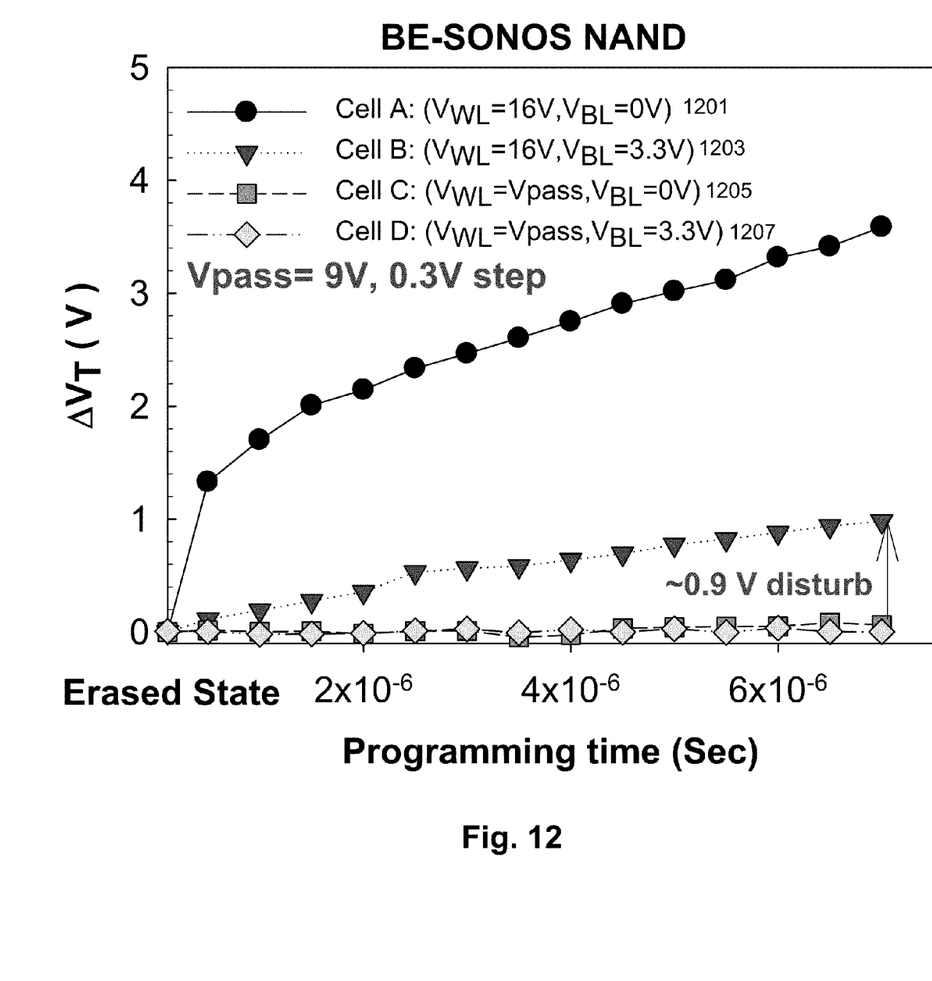

FIGS. 11-12 show traces of threshold voltage change versus time, of differently biased memory cells in columns of series-connected memory cells undergoing a programming operation with self-boosting according to the ISPP method, such as in FIG. 1.

FIG. 11 show traces of threshold voltage change versus time over nearly 8 usec, for a programming operation with self-boosting, akin to that shown in FIGS. 2-4. Undefined voltages of FIG. 1 are as follows. Voltage $V_{CC}$ of bit line $BL_2$ is 3.3 V. Voltage $V_{PGM}$ of word line $WL_7$ is 16 V. Voltage $V_{PASS}$ of the other word lines WL# (but not $WL_7$) is a constant 9 V. Trace 1101 corresponds to cell "A", and rises to about 3.5 V. Trace 1103 corresponds to cell "B", and rises to about 1.5 V. Trace 1105 corresponds to cell "C", and remains at 0 V. Trace 1107 corresponds to cell "D", and remains at 0 V. The end voltage of trace 1103 shows a program disturb of 1.5 V.

FIG. 12 show traces of threshold voltage change versus time over nearly 8 usec, for a programming operation with self-boosting, akin to that shown in FIGS. 5-7. Undefined voltages of FIG. 1 are as follows. Voltage $V_{CC}$ of bit line $BL_2$ is 3.3 V. Voltage $V_{PGM}$ of word line $WL_7$ is 16 V. Voltage $V_{PASS}$ of the other word lines WL# (but not $WL_7$) begins at 9 V, and is increased at 0.3 V steps. Trace 1201 corresponds to cell "A", and rises to about 3.5 V. Trace 1203 corresponds to cell "B", and rises to about 0.9 V. Trace 1205 corresponds to cell "C", and remains at 0 V. Trace 1207 corresponds to cell "D", and remains at 0 V. The end voltage of trace 1203 shows a program disturb of 0.9 V, significantly better than the 1.5 V of FIG. 11. Thus, program disturb is decreased by 40%.

Figure 13:
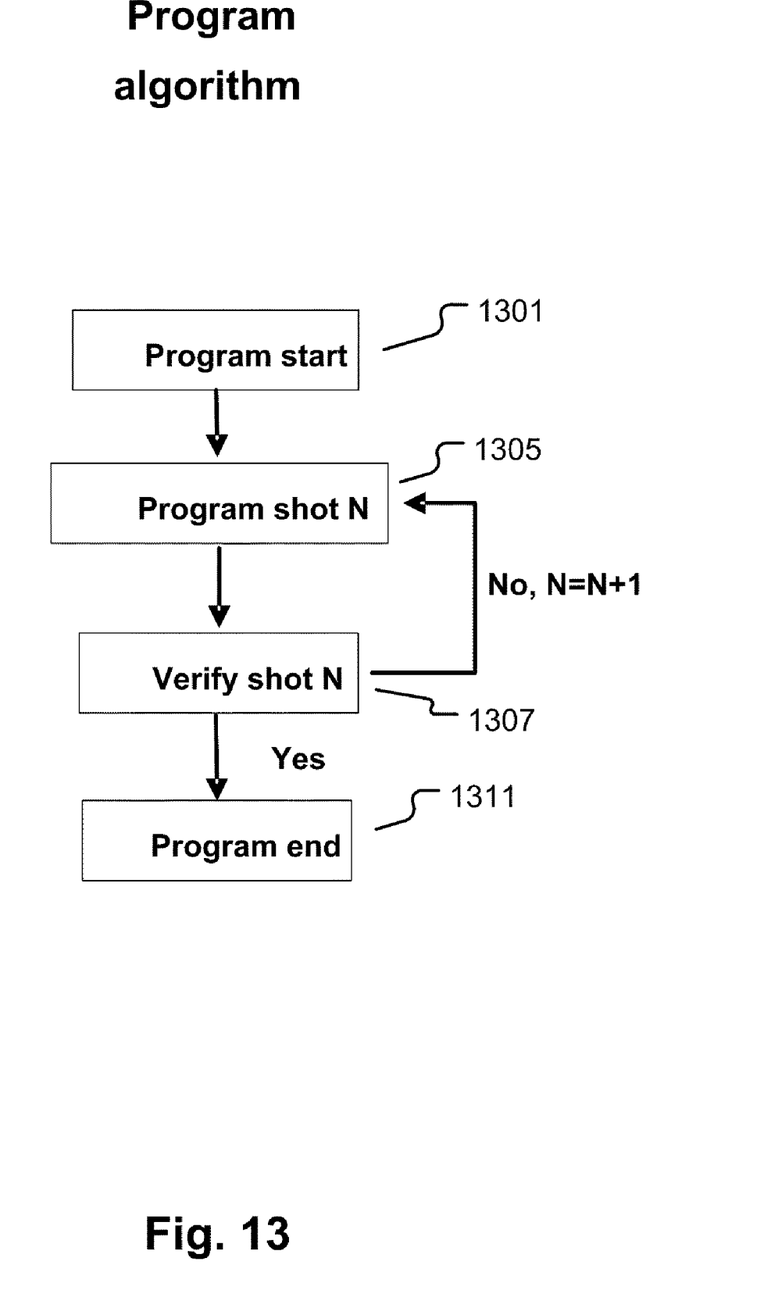
FIG. 13 shows an example algorithm of a programming operation.

FIG. 13 shows an example algorithm of a programming operation. After the programming operation starts 1301, a series of program shots 1305 are repeated, until program verify 1307 is successful, followed by the programming operation end 1311.

Figure 14:
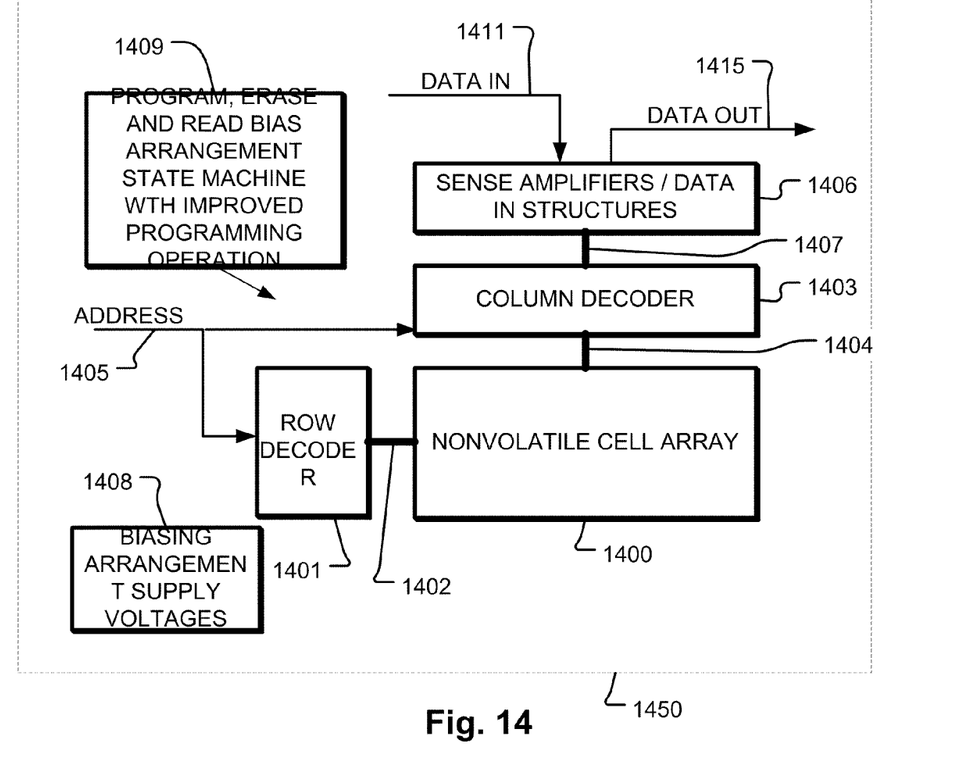
FIG. 14 shows a block diagram of columns of series-connected memory cells undergoing an improved programming operation with self-boosting.

FIG. 14 shows a block diagram of columns of series-connected memory cells undergoing an improved programming operation with self-boosting.

The integrated circuit 1450 includes a memory array 1400 implemented using memory cells on a semiconductor substrate. Addresses are supplied on bus 1405 to column decoder 1403 and row decoder 1401. Sense amplifiers and data-in structures in block 1406 are coupled to the column decoder 1403 via data bus 1407. The row decoder 1401 is coupled to a plurality of word lines 1402 arranged along rows in the memory array 1400. The column decoder 1403 is coupled to a plurality of bit lines 1404 arranged along columns in the memory array 1400. Data is supplied via the data-in line 1411 from input/output ports on the integrated circuit 1450, or from other data sources internal or external to the integrated circuit 1450, to the data-in structures in block 1406. Data is supplied via the data-out line 1415 from the block 1406 to input/output ports on the integrated circuit 1450, or to other data destinations internal or external to the integrated circuit 1450. The integrated circuit 1450 may also include circuitry directed a mission function other than the nonvolatile storage with resistive elements (not shown). Bias arrangement state machine 1409 controls the application of bias arrangement supply voltages 1408, including the decreased or eliminated programming disturb.

Figure 15A:
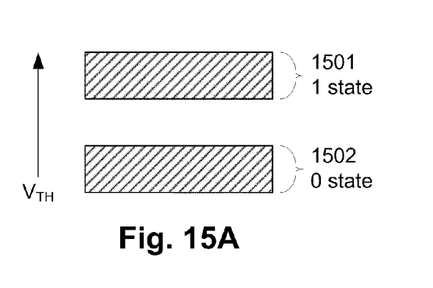
FIGS. 15A-D are diagrams showing various exemplary arrangements of multiple distinct possible logical states of a charge storage state.
Figure 15B:
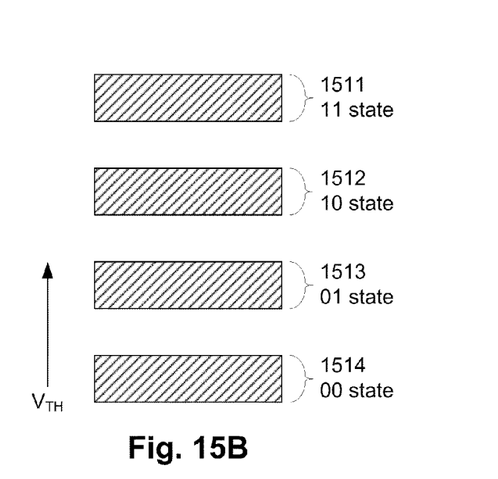
Figure 15C:
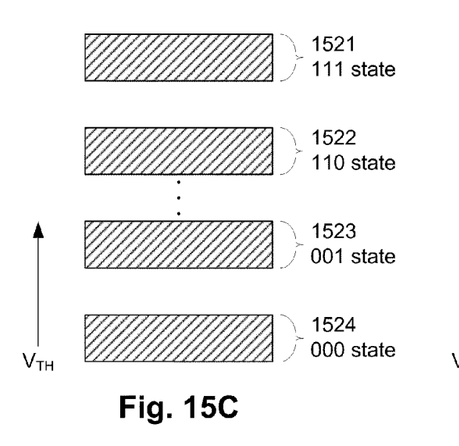
Figure 15D:
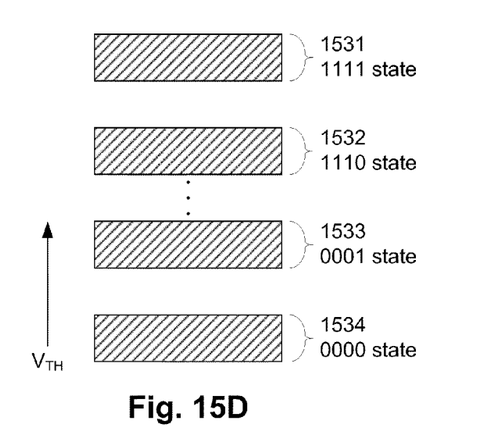

FIGS. 15A-D are diagrams showing various exemplary arrangements of multiple distinct possible logical states of a charge storage state. FIGS. 15A, 15B, 15C, and 15D are threshold state schematics corresponding to 1 bit, 2 bits, 3 bits, and 4 bits, respectively. FIG. 15A shows a schematic for two-level threshold state operation. There are two states, the 1 state 1501 and the 0 state 1502. FIG. 15B shows a schematic for four-level threshold state operation. There are 4 states, the 11 state 1511, the 10 state 1512, the 01 state 1513, and the 00 state 1514. FIG. 15C shows a schematic for 8-level threshold state operation. There are 8 states, of which 4 states are shown, the 111 state 1521, the 110 state 1522, the 001 state 1523, and the 000 state 1524. FIG. 15D shows a schematic for 16-level threshold state operation. There are 16 states, of which 4 states are shown, the 1111 state 1531, the 1110 state 1532, the 0001 state 1533, and the 0000 state 1534. The threshold state schematics of FIGS. 15B, 15C, and 15D show possible implementations of multi-level cell applications, applied to the single charge storage state of a memory cell. Different carrier movement processes can be applied for different parts of the threshold voltage region. For example, carrier movement processes that program via hole injection can program the threshold states with lower threshold voltages, carrier movement processes that program via electron injection can program the threshold states with higher threshold voltages, and a reset process can program a threshold states with an intermediate threshold voltage. Another embodiment uses single level cell technology of one-bit per charge storage state.

Figure 16:
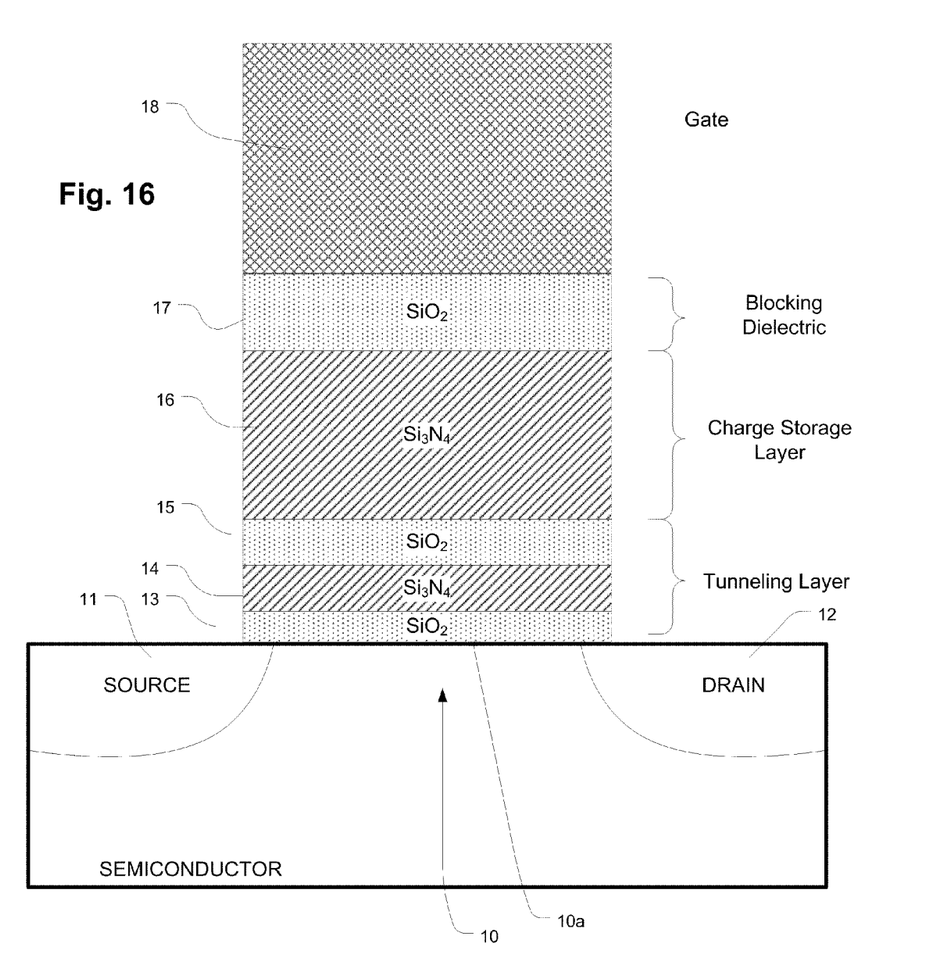
FIG. 16 is a simplified diagram of an embodiment of a memory cell programmed according to the present technology.

FIG. 16 is a simplified diagram of a charge trapping memory cell employing a blocking dielectric layer and a bandgap engineered dielectric tunneling layer. The memory cell includes a channel 10, a source 11 and a drain 12 adjacent the channel in a semiconductor body.

A gate 18 in this embodiment comprises p+ polysilicon. N+ polysilicon may also be used. Other embodiments employ metals, metal compounds or combinations of metals and metal compounds for the gate 18, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 16, the dielectric tunneling layer comprises a composite of materials, including a first layer 13, referred to as a hole tunneling layer, of silicon dioxide on the surface 10a of the channel 10 formed for example using in-situ steam generation ISSG with optional nitridation by either a post deposition NO anneal or by addition of NO to the ambient during deposition. The thickness of the first layer 13 of silicon dioxide is less than 20 Å, and preferably 15 Å or less. Representative embodiments are 10 Å or 12 Å thick.

A layer 14, referred to as a band offset layer, of silicon nitride lies on the first layer 13 of silicon oxide formed for example using low-pressure chemical vapor deposition LPCVD, using for example dichlorosilane DCS and $NH_3$ precursors at 680 C. In alternative processes, the band offset layer comprises silicon oxynitride, made using a similar process with an $N_2O$ precursor. The thickness of the layer 14 of silicon nitride is less than 30 Å, and preferably 25 Å or less.

A second layer 15 of silicon dioxide, referred to as an isolation layer, lies on the layer 14 of silicon nitride formed for example using LPCVD high temperature oxide HTO deposition. The thickness of the second layer 15 of silicon dioxide is less than 35 Å, and preferably 25 Å or less.

A charge trapping layer 16 in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer in this embodiment comprises a buffer layer 17. The buffer layer of silicon dioxide can be formed by wet conversion from the nitride by a wet furnace oxidation process. Other embodiments may be implemented using high temperature oxide (HTO) or LPCVD SiO2. An aluminum oxide capping dielectric layer can be made by atomic vapor deposition, with a post rapid thermal anneal at about 900° C. for 60 seconds to strengthen the film.

In a representative embodiment, the first layer 13 can be 13 Å of silicon dioxide; the band offset layer 14 can be 20 Å of silicon nitride; the isolation layer 15 can be 25 Å of silicon dioxide; the charge trapping layer 16 can be 70 Å of silicon nitride; and the blocking dielectric layer 17 can be of silicon oxide between 40 Å and 60 Å. The gate material can be p+ polysilicon (work function about 5.1 eV).

Figure 17:
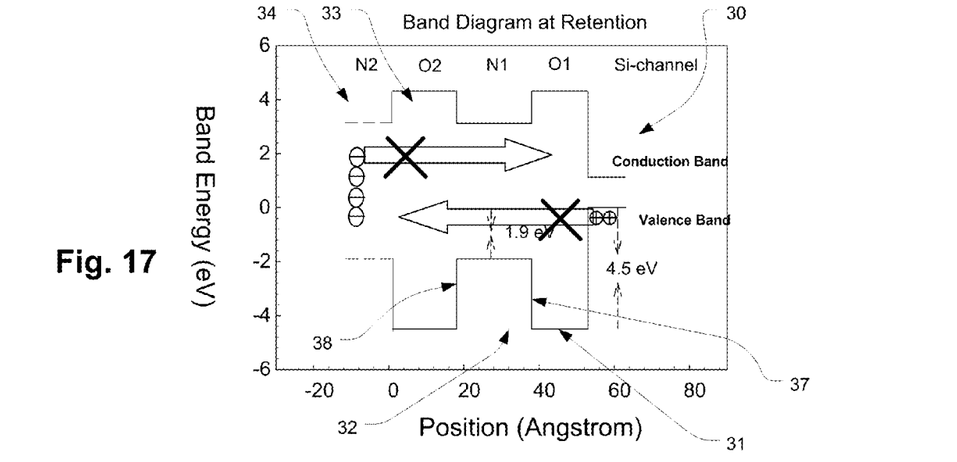
FIG. 17 is a band diagram for a tunneling dielectric layer including band offset technology at low electric fields.

FIG. 17 is a diagram of the energy levels of the conduction and valence bands of the dielectric tunneling structure including the stack of layers 13-15 of FIG. 16 under a low electric field, showing a "U-shaped" conduction band and an "inverted U-shaped" valence band. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling dielectric layer in all three regions 31, 32, 33 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 30 are blocked by the full thickness of regions 31, 32 and 33 from tunneling to the charge trapping layer (region 34), and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling dielectric structure remains significantly below the valence band in the channel region 30. The tunneling layer described herein therefore is characterized by band offset characteristics, include a relatively large hole tunneling barrier height in a thin layer (region 31) at the interface with the semiconductor body, and an increase 37 in valence band energy level at a first location spaced less than 2 nm from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

Figure 18:
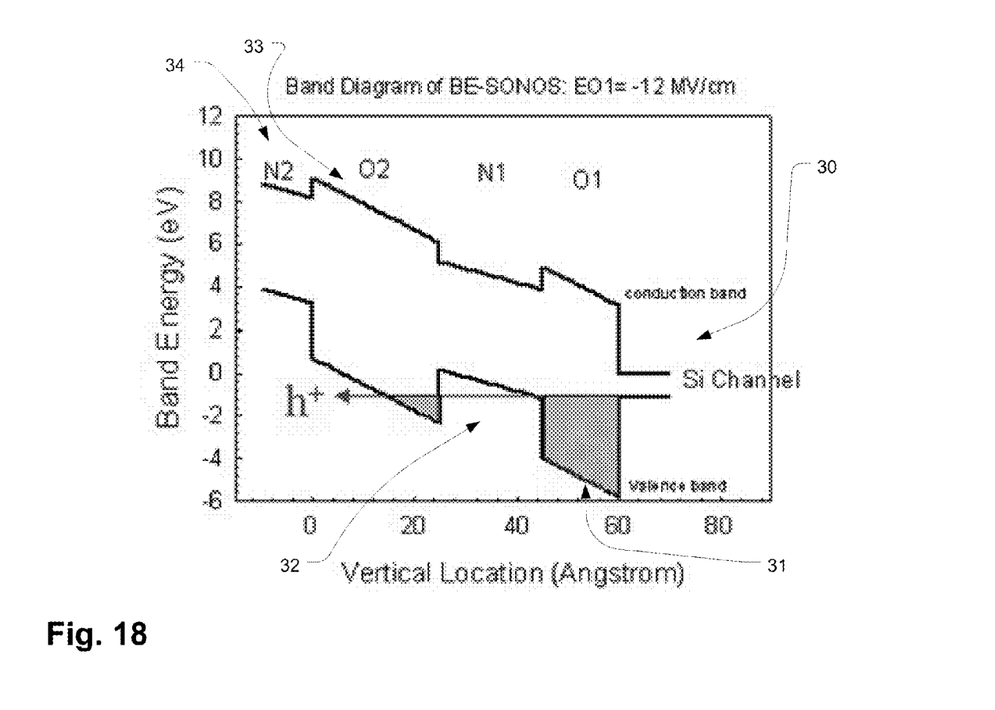
FIG. 18 is a band diagram for a tunneling dielectric layer including band offset technology at high electric fields.

FIG. 18 shows the band diagram for the dielectric tunneling structure under conditions of an electric field of about −12 MV/cm in the tunneling region 31, for the purposes of inducing hole tunneling (as shown, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region. Therefore, the hole tunneling probability is increased substantially as the area (shaded in the Figure) between the level of the valence band in the channel and above the sloped, inverted U-shaped valence band in the tunneling stack is reduced. The band offset effectively eliminates the blocking function of the offset layer in region 32 and isolation layer in region 33 from the tunneling dielectric during high electric field allowing a large hole tunneling current under relatively small electric fields (e.g. E<14 MV/cm).

The isolation layer (region 33) isolates the offset layer 32 from a charge trapping layer (region 34). This increases the effective blocking capability during low electric field for both electrons and holes, improving charge retention.

The offset layer 32 in this embodiment must be thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling dielectric layer can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using bandgap engineering.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit memory device, comprising:
a plurality of memory cells including a memory cell selected for programming;
a plurality of word lines coupled to the memory cells, the plurality of word lines including a first word line and a second word line; and
a circuit coupled to the word lines, the circuit adapted to program the memory cell selected for programming, by performing:
during a first programming period, provide a first voltage to the first word line and a second voltage to the second word line, and
during a second programming period, provide a third voltage to the first word line and a fourth voltage to the second word line,
wherein an absolute value of the third voltage is larger than an absolute value of the first voltage, and an absolute value of the fourth voltage is larger than an absolute value of the second voltage.

2. The integrated circuit memory device of claim 1, wherein the plurality of memory cells is a NAND memory array.

3. The integrated circuit memory device of claim 1, wherein the plurality of memory cells is a nonvolatile NAND memory array.

4. The integrated circuit memory device of claim 1, wherein a magnitude of program disturb of a memory cell of the plurality of memory cells not selected for programming and receiving gate voltage from the first word line, is less than 1 volt.

5. The integrated circuit memory device of claim 1, wherein a first difference between the absolute values of the first voltage and the third voltage is between 0.1 V to 0.5 V, and a second difference between the absolute values of the second voltage and the fourth voltage is between 0.1 V to 0.5 V.

6. The integrated circuit memory device of claim 1, wherein the first voltage, the second voltage, the third voltage, and the fourth voltage are applied for periods between 0.1 µs to 20 µs.

7. The integrated circuit memory device of claim 1, wherein the absolute values of the first voltage and the third voltage are between 6 V to 13 V.

8. The integrated circuit memory device of claim 1, wherein at least one memory cell of the plurality of memory cells has a charge storage structure that includes polysilicon.

9. The integrated circuit memory device of claim 1, wherein at least one memory cell of the plurality of memory cells has a charge storage structure includes charge trapping material.

10. The integrated circuit memory device of claim 1, wherein at least one memory cell of the plurality of memory cells has one or more storage dielectric structures that include:
a tunneling dielectric layer contacting a first one of a gate and a channel surface of a semiconductor body region; and
a blocking dielectric layer contacting a charge trapping layer, the blocking dielectric layer comprising a first layer contacting the charge trapping dielectric layer and a second layer contacting another one of the gate and the channel surface.

11. The integrated circuit memory device of claim 1, wherein, the plurality of memory cells includes a plurality of columns, each column of the plurality of columns including a series of memory cells arranged having a first end and a second end, each memory cell of the series of memory cells including:
a semiconductor body region including source and drain regions;
a charge storage structure storing at least one charge storage state;
one or more storage dielectric structures at least partly between the charge trapping structure and a semiconductor body region, and at least partly between the charge trapping structure and a gate.

12. The integrated circuit memory device of claim 1, wherein subsequent voltages applied to the first word line and the second word line to program the memory cell selected for programming, are applied to retry programming in response to failure to verify successful programming of the data in the memory cell selected for programming.

13. An integrated circuit memory device, comprising:
a plurality of memory cells including a memory cell selected for programming;
a plurality of conductive lines coupled to the memory cells, the plurality of conductive lines including a first conductive line and a second conductive line; and
a circuit applying, during a same period of programming the memory cell selected for programming, a first plurality of pulses to the first conductive line and a second plurality of pulses to the second conductive line during a same period,
wherein the first plurality of pulses includes multiple pulses having different magnitudes, and the second plurality of pulses includes multiple pulses having different magnitudes.

14. The integrated circuit memory device of claim 13, wherein the plurality of memory cells is a NAND memory array.

15. The integrated circuit memory device of claim 13, wherein the plurality of memory cells is a nonvolatile NAND memory array.

16. The integrated circuit memory device of claim 13, wherein a magnitude of program disturb of a memory cell of the plurality of memory cells not selected for programming and receiving gate voltage from the first conductive line, is less than 1 volt.

17. The integrated circuit memory device of claim 13, wherein a voltage step magnitude of 0.1 V to 0.5 V characterizes neighboring pulses of the first plurality of pulses and the second plurality of pulses.

18. The integrated circuit memory device of claim 13, wherein the multiple pulses of the first plurality of pulses, and the multiple pulses of the second plurality of pulses are applied for periods between 0.1 µs to 20 µs.

19. The integrated circuit memory device of claim 13, wherein the first plurality of pulses and the second plurality of pulses begin with a voltage magnitude between 6 V to 13 V.

20. The integrated circuit memory device of claim 13, wherein at least one memory cell of the plurality of memory cells has a charge storage structure that includes polysilicon.

21. The integrated circuit memory device of claim 13, wherein at least one memory cell of the plurality of memory cells has a charge storage structure includes charge trapping material.

22. The integrated circuit memory device of claim 13, wherein at least one memory cell of the plurality of memory cells has one or more storage dielectric structures that include:
   a tunneling dielectric layer contacting a first one of a gate and a channel surface of a semiconductor body region; and
   a blocking dielectric layer contacting a charge trapping layer, the blocking dielectric layer comprising a first layer contacting the charge trapping dielectric layer and a second layer contacting another one of the gate and the channel surface.

23. The integrated circuit memory device of claim 13, wherein, the plurality of memory cells includes a plurality of columns, each column of the plurality of columns including a series of memory cells arranged having a first end and a second end, each memory cell of the series of memory cells including:
   a semiconductor body region including source and drain regions;
   a charge storage structure storing at least one charge storage state;
   one or more storage dielectric structures at least partly between the charge trapping structure and a semiconductor body region, and at least partly between the charge trapping structure and a gate.

24. The integrated circuit memory device of claim 13, wherein subsequent voltages applied to the first conductive line and the second conductive line to program the memory cell selected for programming, are applied to retry programming in response to failure to verify successful programming of the data in the memory cell selected for programming.

* * * * *